(12) United States Patent
Wang et al.

(10) Patent No.: US 11,018,184 B2
(45) Date of Patent: May 25, 2021

(54) MAGNETORESISTIVE RANDOM ACCESS MEMORY WITH PARTICULAR SHAPE OF DIELECTRIC LAYER

(71) Applicant: UNITED MICROELECTRONICS CORP., Hsin-Chu (TW)

(72) Inventors: Hui-Lin Wang, Taipei (TW); Chen-Yi Weng, New Taipei (TW); Ying-Cheng Liu, Tainan (TW); Yi-Hui Lee, Taipei (TW); Chin-Yang Hsieh, Tainan (TW); Yi-An Shih, Changhua County (TW); Jing-Yin Jhang, Tainan (TW); I-Ming Tseng, Kaohsiung (TW); Yu-Ping Wang, Taoyuan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/532,492

(22) Filed: Aug. 6, 2019

(65) Prior Publication Data
US 2021/0020691 A1 Jan. 21, 2021

(30) Foreign Application Priority Data
Jul. 19, 2019 (CN) .......................... 201910653783.6

(51) Int. Cl.
| | |
|---|---|
| H01L 27/22 | (2006.01) |
| G11C 11/16 | (2006.01) |
| H01L 43/02 | (2006.01) |
| H01F 10/32 | (2006.01) |
| H01F 41/34 | (2006.01) |
| H01L 43/12 | (2006.01) |

(52) U.S. Cl.
CPC .......... *H01L 27/222* (2013.01); *G11C 11/161* (2013.01); *H01F 10/3254* (2013.01); *H01F 41/34* (2013.01); *H01L 43/02* (2013.01); *H01L 43/12* (2013.01)

(58) Field of Classification Search
CPC ............. H01L 27/222; H01L 21/31116; H01L 27/228; H01L 43/02; H01L 43/08; H01L 27/2436; G11C 11/161
USPC ........................................... 257/427; 438/48
See application file for complete search history.

(56) References Cited

U.S. PATENT DOCUMENTS

| | | | | |
|---|---|---|---|---|
| 9,780,301 | B1 * | 10/2017 | Chuang ................... | H01L 43/02 |
| 10,163,651 | B1 * | 12/2018 | Chen .................. | H01L 21/31116 |
| 10,580,968 | B1 * | 3/2020 | Yi ............................ | H01L 43/02 |
| 2010/0103718 | A1 * | 4/2010 | Asao .................... | G11C 11/1659 |
| | | | | 365/148 |
| 2012/0068286 | A1 * | 3/2012 | Hosotani ................. | H01L 43/08 |
| | | | | 257/421 |
| 2017/0062520 | A1 * | 3/2017 | Sato ....................... | H01L 27/228 |
| 2018/0006085 | A1 * | 1/2018 | Chuang ................. | H01L 27/222 |
| 2018/0097175 | A1 * | 4/2018 | Chuang ................... | H01L 43/08 |

(Continued)

*Primary Examiner* — Didarul A Mazumder
(74) *Attorney, Agent, or Firm* — Winston Hsu

(57) ABSTRACT

A magnetoresistive random access memory (MRAM), including multiple cell array regions, multiple MRAM cells disposed in the cell array region, a silicon nitride liner conformally covering on the MRAM cells, an atomic layer deposition dielectric layer covering on the silicon nitride liner in the cell array region, wherein the surface of atomic layer deposition dielectric layer is a curved surface concave downward to the silicon nitride liner at the boundary of MRAM cells, and an ultra low-k dielectric layer covering on the atomic layer deposition dielectric layer.

11 Claims, 7 Drawing Sheets

(56) References Cited

U.S. PATENT DOCUMENTS

2019/0165258 A1* 5/2019 Peng .................... H01L 27/226
2020/0127053 A1* 4/2020 Chen ................... H01L 27/2436

* cited by examiner

MAGNETORESISTIVE RANDOM ACCESS MEMORY WITH PARTICULAR SHAPE OF DIELECTRIC LAYER

BACKGROUND OF THE INVENTION

1. Field of the Invention

The present invention generally relates to a magnetoresistive random access memory (MRAM) structure, and more specifically, to a magnetoresistive random access memory structure with particular shape of dielectric layer.

2. Description of the Prior Art

Magnetoresistance (MR) effect has been known as a kind of effect caused by altering the resistance of a material through variation of outside magnetic field. The physical definition of such effect is defined as a variation in resistance obtained by dividing a difference in resistance under no magnetic interference by the original resistance. Currently, MR effect has been successfully utilized in production of hard disks thereby having important commercial values. Moreover, the characterization of utilizing GMR materials to generate different resistance under different magnetized states could also be used to fabricate magnetoresistive random access memory (MRAM) devices, which typically has the advantage of keeping stored data even when the device is not connected to an electrical source.

The aforementioned MR effect has also been used in magnetic field sensor areas including, for example, electronic compass components used in global positioning system (GPS) of cellular phones for providing information regarding moving location to users. Currently, various magnetic field sensor technologies such as anisotropic magnetoresistance (AMR) sensors, giant magnetoresistance (GMR) sensors, magnetic tunnel junction (MTJ) sensors have been widely developed in the market.

SUMMARY OF THE INVENTION

One aspect of the present invention is to provide a magnetoresistive random access memory structure, including a substrate with multiple cell array regions, multiple magnetoresistive random access memory cells disposed in each cell array region, a silicon nitride liner conformally covering on the substrate and the multiple magnetoresistive random access memory cells, anatomic layer deposition (ALD) dielectric layer covering on the silicon nitride liner in the cell array regions, wherein a surface of atomic layer deposition dielectric layer is a curved surface concave downward to the silicon nitride liner at boundaries of cell array regions, and an ultra low-k dielectric layer covering on the atomic layer deposition dielectric layer.

Another aspect of the present invention is to provide a magnetoresistive random access memory structure, including a substrate with multiple cell array regions and multiple word line regions between the cell array regions, multiple magnetoresistive random access memory cells disposed in each cell array region, a silicon nitride liner conformally covering on the cell array regions and the multiple magnetoresistive random access memory cells and extending to boundaries between the cell array regions and the word line regions, an atomic layer deposition (ALD) dielectric layer covering on the silicon nitride liner in the cell array regions, wherein a surface of atomic layer deposition dielectric layer is a curved surface concave downward to the silicon nitride liner at boundaries between the cell array regions and the word line regions; an ultra low-k dielectric layer covering on the atomic layer deposition dielectric layer and the word line regions, and word lines in the ultra low-k dielectric layer on the word line regions.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

Figure 1:
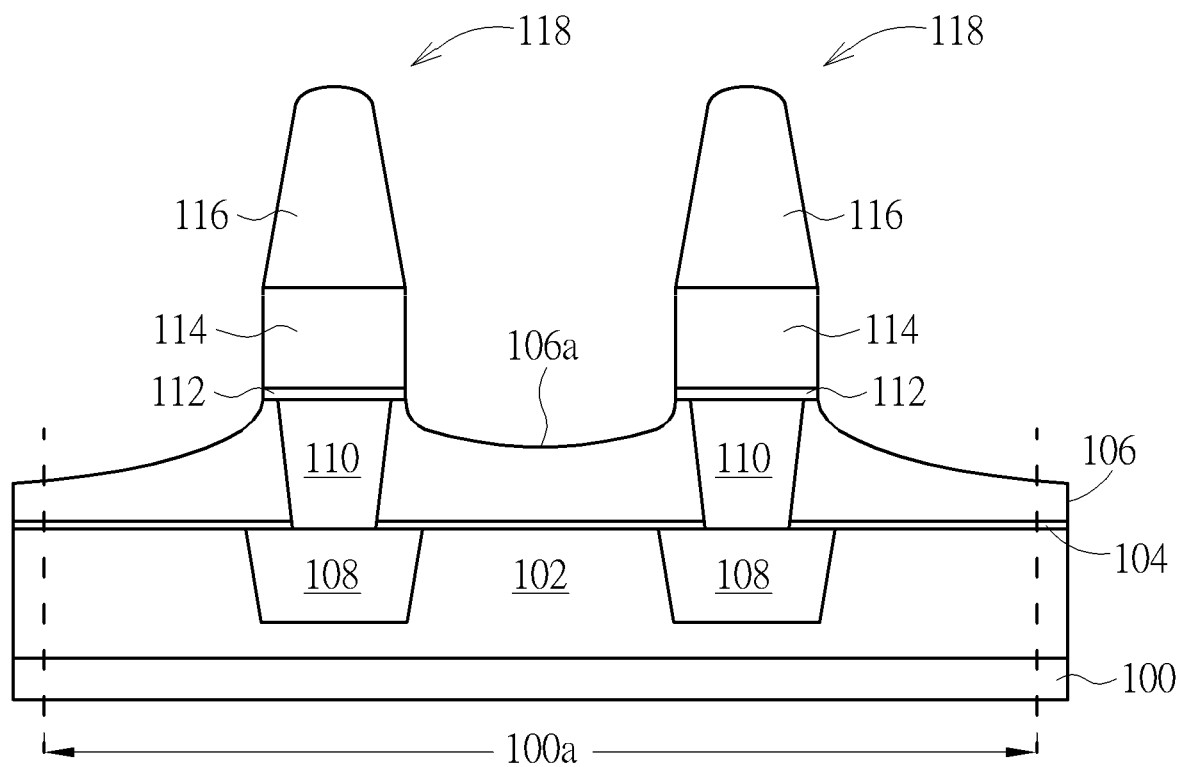
FIGS. 1-7 are schematic cross-sections illustrating the method of fabricating a magnetoresistive random access memory (MRAM) structure in accordance with the embodiment of present invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

Reference now be made in detail to exemplary embodiments of the invention, which are illustrated in the accompanying drawings in order to understand and implement the present disclosure and to realize the technical effect. It can be understood that the following description has been made only by way of example, but not to limit the present disclosure. Various embodiments of the present disclosure and various features in the embodiments that are not conflicted with each other can be combined and rearranged in various ways. Without departing from the spirit and scope of the present disclosure, modifications, equivalents, or improvements to the present disclosure are understandable to those skilled in the art and are intended to be encompassed within the scope of the present disclosure.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Please refer to FIGS. 1-7. FIGS. 1-7 are schematic cross-sections illustrating a method of fabricating a magnetoresistive random access memory (MRAM) structure in accordance with the embodiment of present invention. As shown in FIG. 1, a substrate 100 made of semiconductor material is first provided, in which the semiconductor material may be selected from the group consisting of silicon (Si), germanium (Ge), silicon germanium (SiGe) compounds, silicon carbide (SiC), gallium arsenide (GaAs), etc. The substrate 100 is preferably defined with multiple cell array regions 100a thereon, wherein each cell array region is disposed with multiple magnetoresistive random access memory cells 118. For the clarify and conciseness of drawings and specification, the embodiment shown in FIGS. 1-4 exemplifies the structure with only single cell array region 100a and two adjacent magnetoresistive random access memory cells 118 as an example. In actual implementation, each cell array region 100a would include multiple magnetoresistive random access memory cells 118, and the defined cell array regions 100a might be adjacent to each other.

An inter-metal dielectric (IMD) layer 102, a stop layer 104 and an inter-layer dielectric (ILD) layer 106 are formed sequentially on the substrate 100. The material of inter-metal dielectric layer 102 is preferably ultra low-k material, such as porous silicon oxide carbides (SiOC). The material of stop layer 104 is preferably nitrogen doped carbide, silicon nitride, silicon carbonitride (SiCN), etc, and the material of inter-layer dielectric layer 106 is preferably tetraethoxysilane (TEOS), but not limited thereto, wherein metal layers 108 and contact plugs 110 may be formed respectively in the inter-metal dielectric layer 102 and the inter-layer dielectric layer 106 by using single damascene process or dual damascene process. The metal layer 108 and the contact plug 110 may be embedded in the inter-metal dielectric layer 102, the stop layer 104 and the inter-layer dielectric layer 106 and electrically connect with each other. The material of metal layer 108 and contact plug 110 may be selected from the group of tungsten (W), copper (Cu), aluminum (Al), titanium aluminum (TiAl) alloy, cobalt-tungsten-phosphorous (CoWP) alloy, etc, but not limited thereto.

Please refer again to FIG. 1. A bottom electrode layer 112, a magnetic tunnel junction (MTJ) stack 114 and a top electrode layer 116 are further formed sequentially on the inter-layer dielectric layer 106. The bottom electrode layer 112, the magnetic tunnel junction stack 114 and the top electrode layer 116 may be in-situ formed in the same chamber by using physical vapor deposition (PVD). In the embodiment of present invention, the material of bottom electrode layer 112 preferably includes conductive materials such as tantalum nitride (TaN), but not limited thereto. According to other embodiment of the present invention, the bottom electrode layer 112 may include tantalum (Ta), platinum (Pt), copper (Cu), gold (Au), aluminum (Al) or the combination thereof. The magnetic tunnel junction stack 114 is a multilayer structure, which may include structures like seed layer, pinned layer, reference layer, tunneling barrier layer, free layer and metal spacer. Generally, the pinned layer could be made of antiferromagnetic (AFM) material including but not limited to for example ferromanganese (FeMn), platinum manganese (PtMn), iridium manganese (IrMn), nickel oxide (NiO), or combination thereof, to fix or restrict the direction of magnetic moment of adjacent layers. The tunneling barrier layer could include oxide containing insulating material such as aluminum oxide ($AlO_x$) or magnesium oxide (MgO), but not limited thereto. The free layer could be made of ferromagnetic material including but not limited to iron (Fe), cobalt (Co), nickel (Ni), or the alloys thereof such as cobalt-iron-boron (CoFeB), in which the magnetized direction of the free layer could be altered freely depending on the influence of outside magnetic field. Since detailed structure of the magnetic tunnel junction stack 114 is not the key point of the present invention, all of the aforementioned multilayer structure will be represented by a magnetic tunnel junction stack 114 in the figures.

The aforementioned bottom electrode layer 112, magnetic tunnel junction stack 114 and top electrode layer 116 may be patterned into individual MRAM cells 118 by using photolithographic and etch process. In this step, a reactive ion etching (RIE) process may be first used with a silicon oxide layer as hard mask to pattern the top electrode layer 116, so as to have less sidewall byproduct. An ion beam etching (IBE) process is then used to pattern the magnetic tunnel junction stack 114, the bottom electrode layer 112 and the inter-layer dielectric layer 106 to define the MRAM cells 118. Since the characteristics of ion beam etching process, the top surface 106a of remaining inter-layer dielectric layer 106 after etching would be preferably lower than the top surface of contact plug 110 and is preferably a cambered or curved surface.

Figure 2:
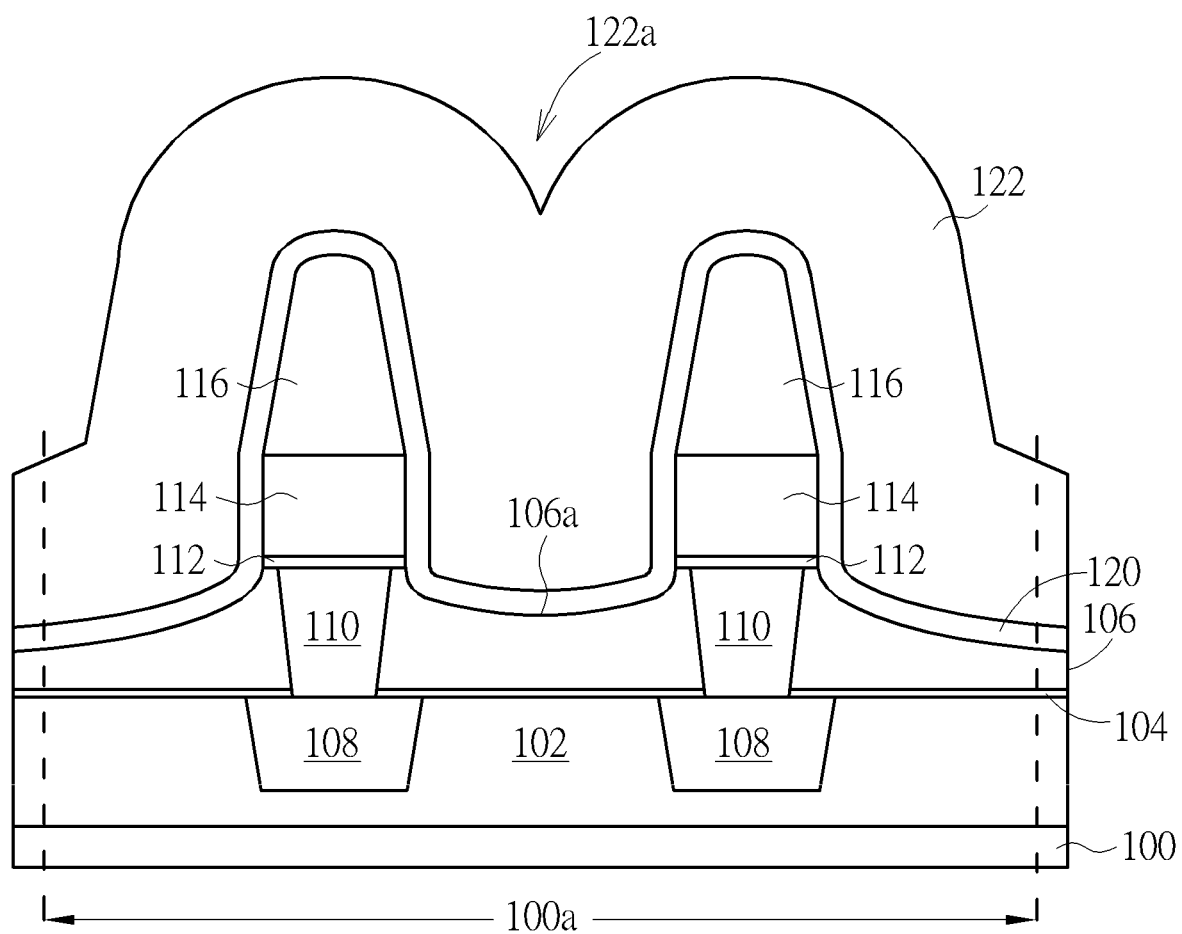

Thereafter, as shown in FIG. 2, forming a conformal liner layer 120 on the surface of MRAM cells 118 and inter-layer dielectric layer 106, wherein the material of liner layer 120 preferably includes silicon nitride. However, other dielectric material such as silicon oxide, silicon oxynitride or silicon oxide carbide may be selected depending on process requirement. An atomic layer deposition (ALD) dielectric layer 122 is then formed on the liner layer 120 with the material including but not limited to tetraethyl orthosilicate (TEOS), silicon oxide, silicon nitride or the combination thereof. In comparison to the approach of using ultra low-k material directly covering on MRAM cells 118 in prior art, atomic layer deposition process is used in the present embodiment to form additional dielectric layer 122 and efficiently prevent gaps formed in the dielectric layer 122 between the MRAM cells 118, thereby achieving better surface coverage. The surface of atomic layer deposition dielectric layer 122 would undulate along with the surface of substrate 100, wherein concave 122a is formed between the MRAM cells 118 in the cell array region 100a.

Figure 3:
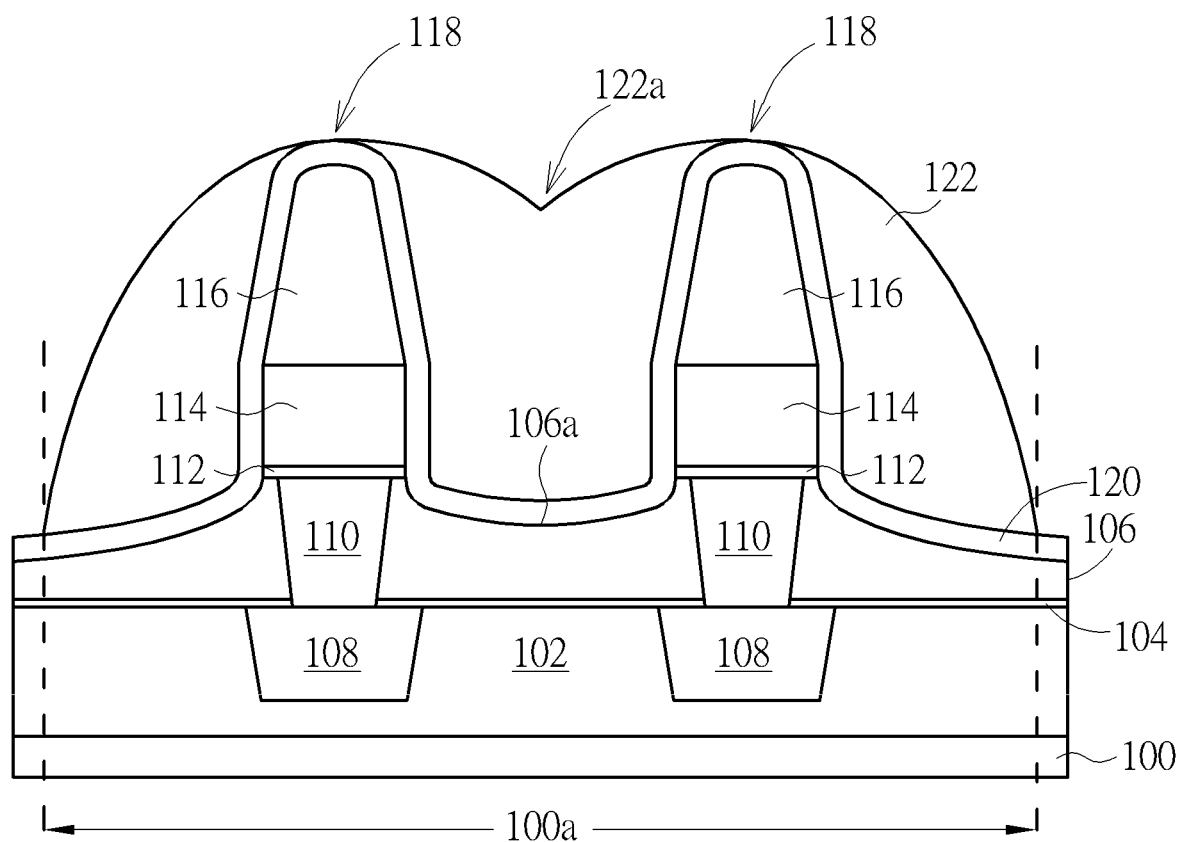

Thereafter, as shown in FIG. 3, performing an etch back process to remove the atomic layer deposition dielectric layer 122 outside the cell array region 100a and to expose the silicon nitride liner layer 120 from the atomic layer deposition dielectric layer 122 on the MRAM cells 118. The exposed silicon nitride liner layer 120 is flush with the surface of atomic layer deposition dielectric layer 122. Due to the etch back process, the surface of atomic layer deposition dielectric layer 122 will be a curved surface concave downward to the silicon nitride liner layer 120 at boundaries of cell array regions 100a. The atomic layer deposition dielectric layer 122 would still fill up the gaps between the MRAM cells 118 after etching and concaves 122a are formed between the MRAM cells 118.

Figure 4:
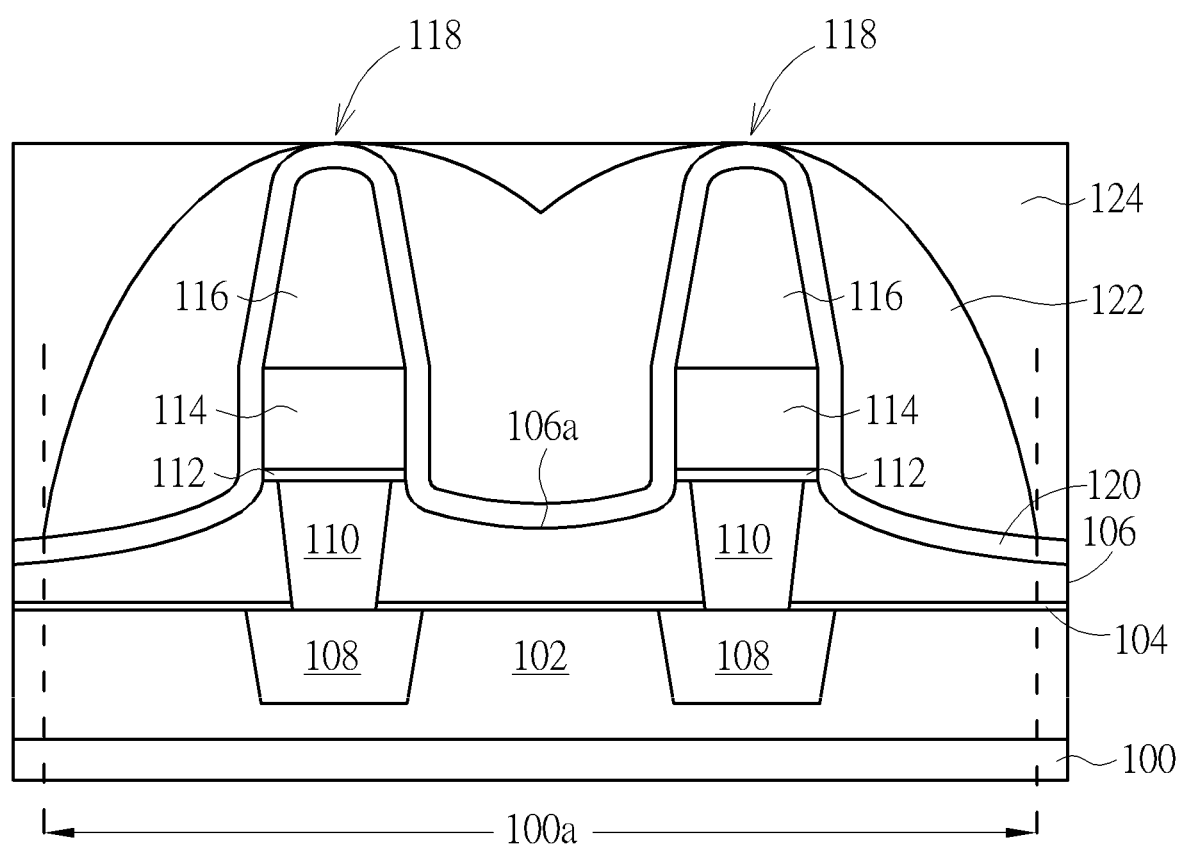

Thereafter, as shown in FIG. 4, another dielectric layer 124 is formed on the atomic layer deposition dielectric layer 122 to fill up the region outside the cell array regions 100a, wherein a planarization process such as chemical mechanical polishing (CMP) is used to planarize the dielectric layer 124 to make the top surface of dielectric layer 124 flush with silicon nitride liner layer 120 and atomic layer deposition dielectric layer 122, so that a flat surface may be provided for later processes. The concaves 122a of the atomic layer deposition dielectric layer 122 between MRAM cells are also filled and leveled up by the dielectric layer 124. In the embodiment of present invention, the material of dielectric layer 124 is preferably ultra low-k material. Please note that the dielectric constant of atomic layer deposition dielectric layer 122 is different from the dielectric constant of dielectric layer 124.

Figure 5:
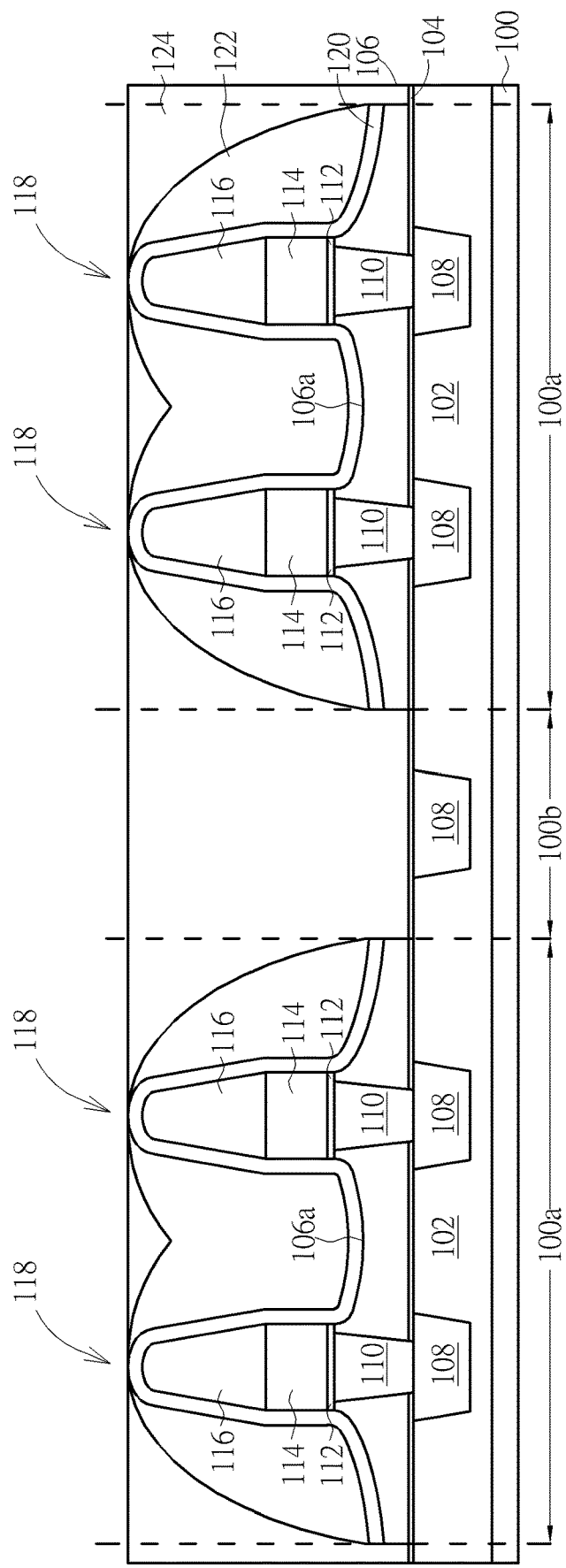

Thereafter, please refer to FIG. 5. In the embodiment of present invention, word line regions 100*b* may be defined between cell array regions 100*a*, where word line is formed to connect the metal layer 108 thereunder. In this regard, after the aforementioned etch back process of the atomic layer deposition dielectric layer 122, a photolithographic and etch process may be further performed to remove the inter-layer dielectric layer 106 and the silicon nitride liner layer 120 on the word line regions 100*b* to expose the underlying stop layer 104, so that the atomic layer deposition dielectric layer 122 would be flush with the silicon nitride liner layer 120 and the inter-layer dielectric layer 106 at boundaries between the cell array regions 100*a* and the word line regions 100*b,* and the dielectric layer 124 in the word line region 100*b* would directly cover on the stop layer 104.

Figure 6:
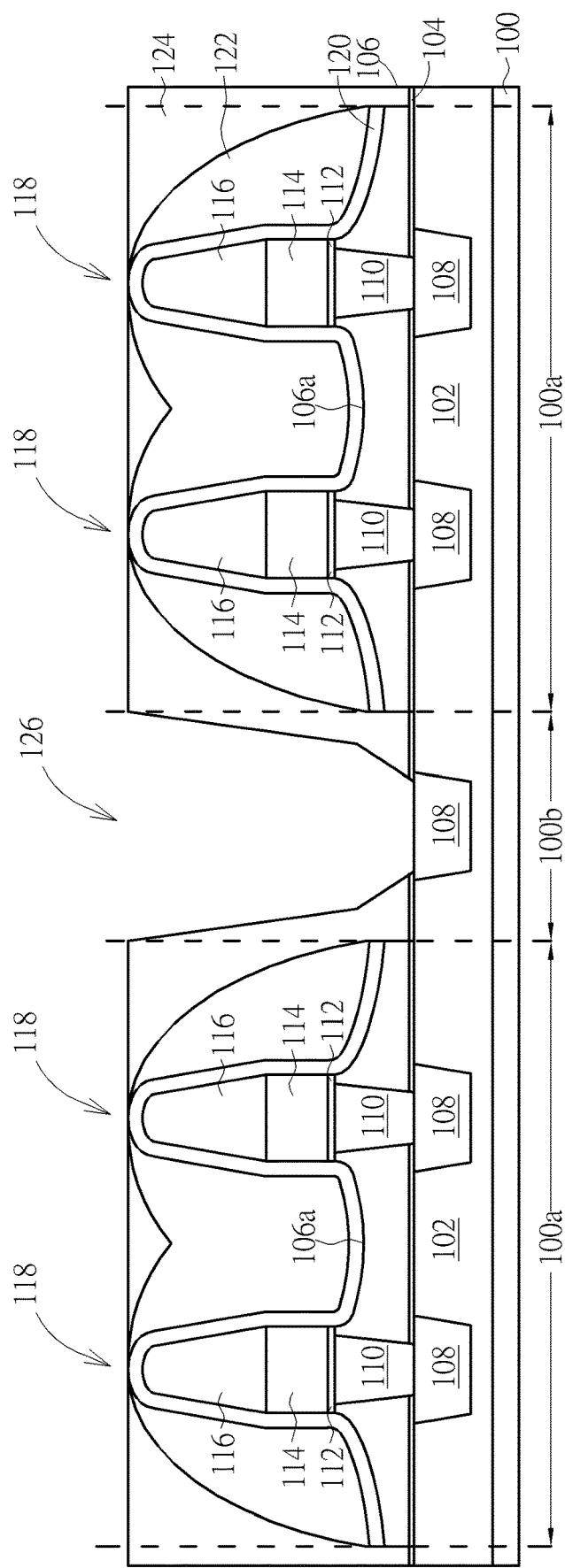

Thereafter, as shown in FIG. 6, another photolithographic and etch process is performed to define word line recesses 126 in the dielectric layer 124 on the word line regions 100*b*. In the embodiment, the etch process preferably includes a dry etch process, with octafluorocyclobutane ($C_4F_8$) and/or tetrafluoromethane ($CF_4$) as main etch gas to remove the dielectric layer 124 and the stop layer 104 and expose the underlying metal layer 108.

Figure 7:
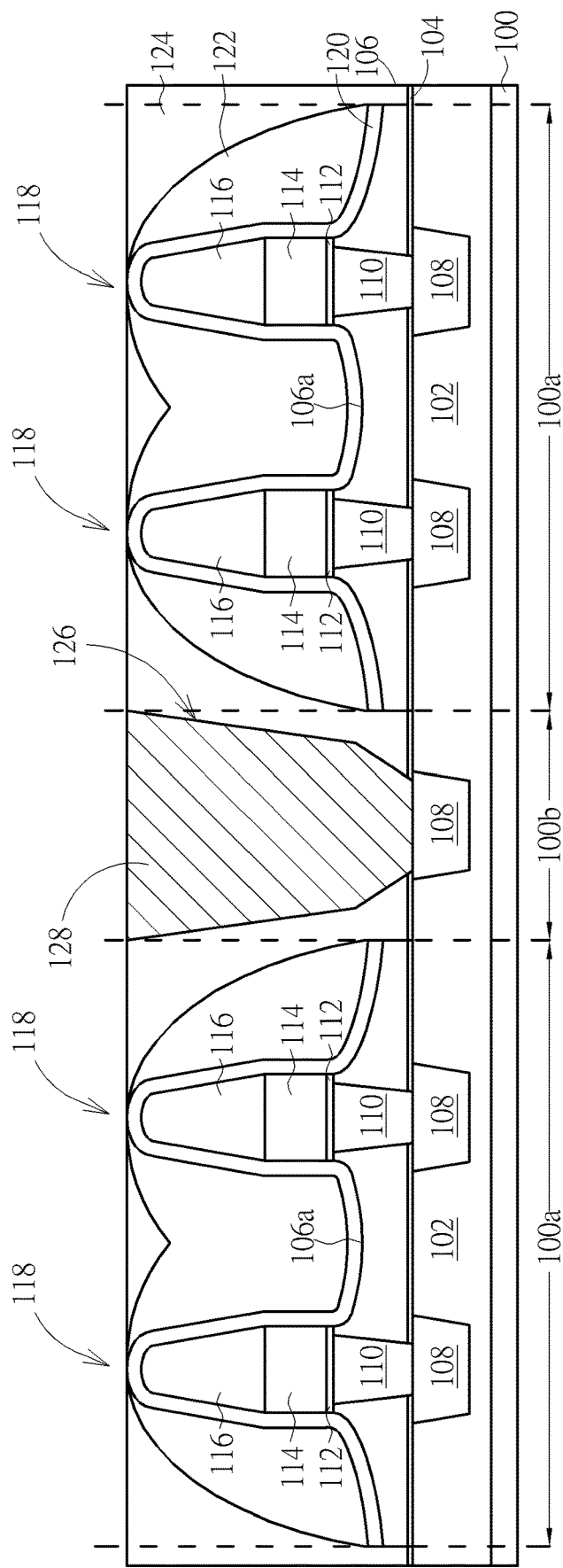

At last as shown in FIG. 7, the word line recess 126 is filled with required metal materials to form a word line 128. The word line 128 may include barrier layers with material like titanium (Ti), titanium nitride (TiN), tantalum (Ta) and/or tantalum nitride (TaN) and low resistance metal layers with material selected from low resistance material like tungsten (W), copper (Cu), aluminum (Al), titanium aluminum (TiAl) alloy, cobalt-tungsten-phosphorous (CoWP) alloy or the combination thereof. A planarization process such as a CMP process is then performed to remove the metal materials outside the word line recess 126, thereby forming the word line 128.

Other structures such as etch stop layer, inter-metal dielectric layer or dual damascene metal structure may be formed on the dielectric layer 124 in later processes. Since these structures and relevant processes are not the key point of present invention, they will not be shown and described in the specification and figures.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A magnetoresistive random access memory structure, comprising:
a substrate with multiple cell array regions;
multiple magnetoresistive random access memory cells disposed in each said cell array region, wherein each said magnetoresistive random access memory cell comprises:
bottom electrode on said substrate;
magnetic tunnel junction stack on said bottom electrode; and
top electrode on said magnetic tunnel junction stack;
a silicon nitride liner conformally covering on said substrate and said multiple magnetoresistive random access memory cells;
an atomic layer deposition (ALD) dielectric layer covering on said silicon nitride liner in said cell array regions and completely filling up a gap between said magnetoresistive random access memory cells except a concave is formed on said atomic layer deposition dielectric layer between said magnetoresistive random access memory cells, wherein said concave is above a top surface of said magnetic tunnel junction stack and between two said magnetic tunnel junction stacks, and a surface of said atomic layer deposition dielectric layer is a curved surface concave downward to said silicon nitride liner at boundaries of said cell array regions; and
an ultra low-k dielectric layer covering on said atomic layer deposition dielectric layer.

2. The magnetoresistive random access memory structure of claim 1, wherein a top surface of said silicon nitride liner on said magnetoresistive random access memory cell is exposed from said atomic layer deposition dielectric layer, and said exposed top surface of said silicon nitride liner is flush with said surface of said atomic layer deposition dielectric layer.

3. The magnetoresistive random access memory structure of claim 1, wherein a dielectric constant of said atomic layer deposition dielectric layer is different from a dielectric constant of said ultra low-k dielectric layer.

4. The magnetoresistive random access memory structure of claim 1, further comprising a conductive plug connecting said bottom electrode of said magnetoresistive random access memory cell to a metal layer in said substrate.

5. The magnetoresistive random access memory structure of claim 1, further comprising a tetraethoxysilane (TEOS) layer between said substrate and said silicon nitride liner.

6. A magnetoresistive random access memory structure, comprising:
a substrate with multiple cell array regions and multiple word line regions between said cell array regions;
multiple magnetoresistive random access memory cells disposed in each said cell array region, wherein each said magnetoresistive random access memory cell comprises:
bottom electrode on said substrate;
magnetic tunnel junction stack on said bottom electrode; and
top electrode on said magnetic tunnel junction stack;
a silicon nitride liner conformally covering on said cell array regions and said multiple magnetoresistive random access memory cells and extending to boundaries between said cell array regions and said word line regions;
an atomic layer deposition (ALD) dielectric layer covering on said silicon nitride liner in said cell array regions and completely filling up a gap between said magnetoresistive random access memory cells except a concave is formed on said atomic layer deposition dielectric layer between said magnetoresistive random access memory cells, wherein said concave is above a top surface of said magnetic tunnel junction stack and between two said magnetic tunnel junction stacks, and a surface of said atomic layer deposition dielectric layer is a curved surface concave downward to said silicon nitride liner at said boundaries between said cell array regions and said word line regions;

an ultra low-k dielectric layer covering on said atomic layer deposition dielectric layer and said word line regions; and word lines in said ultra low-k dielectric layer on said word line regions.

7. The magnetoresistive random access memory structure of claim 6, wherein a top surface of said silicon nitride liner on said magnetoresistive random access memory cell is exposed from said atomic layer deposition dielectric layer, and said exposed top surface of said silicon nitride liner is flush with said surface of said atomic layer deposition dielectric layer.

8. The magnetoresistive random access memory structure of claim 6, wherein said atomic layer deposition dielectric layer is flush with said silicon nitride liner at said boundaries between said cell array regions and said word line regions.

9. The magnetoresistive random access memory structure of claim 6, wherein a dielectric constant of said atomic layer deposition dielectric layer is different from a dielectric constant of said ultra low-k dielectric layer.

10. The magnetoresistive random access memory structure of claim 6, further comprising a conductive plug connecting said bottom electrode of said magnetoresistive random access memory cell to a metal layer in said substrate.

11. The magnetoresistive random access memory structure of claim 6, further comprising a tetraethoxysilane (TEOS) layer between said substrate and said silicon nitride liner.

* * * * *